(12) United States Patent
Martinez Ortigosa et al.

(10) Patent No.: US 10,033,091 B2
(45) Date of Patent: Jul. 24, 2018

(54) IMPEDANCE MATCHING CIRCUIT

(71) Applicant: ADVANCED AUTOMOTIVE ANTENNAS, S.L.U., Barcelona (ES)

(72) Inventors: Enrique Martinez Ortigosa, Barcelona (ES); Ramiro Quintero Illera, Barcelona (ES)

(73) Assignee: ADVANCED AUTOMOTIVE ANTENNAS, S.L.U., Barcelona (ES)

( * ) Notice: Subject to any disclaimer, the term of this patent is extended or adjusted under 35 U.S.C. 154(b) by 49 days.

(21) Appl. No.: 15/224,200

(22) Filed: Jul. 29, 2016

(65) Prior Publication Data

US 2017/0040677 A1    Feb. 9, 2017

(30) Foreign Application Priority Data

Aug. 3, 2015   (EP) .................... 15382411

(51) Int. Cl.

| | |
|---|---|
| *H01Q 1/32* | (2006.01) |
| *H03F 1/56* | (2006.01) |
| *H03H 7/40* | (2006.01) |
| *H03H 11/30* | (2006.01) |
| *H03F 3/19* | (2006.01) |

(Continued)

(52) U.S. Cl.
CPC ............ *H01Q 1/3275* (2013.01); *H01Q 1/36* (2013.01); *H01Q 1/48* (2013.01); *H01Q 5/335* (2015.01); *H03F 1/56* (2013.01); *H03F 3/19* (2013.01); *H03H 7/40* (2013.01); *H03H 11/30* (2013.01)

(58) Field of Classification Search
CPC .......... H01Q 1/3275; H01Q 1/36; H01Q 1/48; H01Q 5/335; H03F 1/56; H03F 3/19; H03H 11/30; H03H 7/40
See application file for complete search history.

(56) References Cited

U.S. PATENT DOCUMENTS

| | | | |
|---|---|---|---|
| 3,891,934 A | 6/1975 | Norton et al. | |
| 5,757,633 A * | 5/1998 | Bowles | H02M 7/49 363/41 |

(Continued)

OTHER PUBLICATIONS

Zhang Y et al.: "Design and Analysis of Noiseless Feedback Amplifiers Using S Parameters", Microwave Journal, Horizon House Publications, Norwood, MA, US, vol. 41, No. 2, Feb. 1, 1998, XP000778917, ISSN: 0192-6225.

(Continued)

*Primary Examiner* — Tho G Phan
(74) *Attorney, Agent, or Firm* — Polsinelli PC

(57) ABSTRACT

A circuit (4) for establishing a desired impedance value for a radio antenna (5) comprising a transistor (3) having an input (8) and an output terminal (6), and a printed radio frequency transformer comprising a first (1) and a second inductor (2), both inductors (1, 2) having a coupling factor value, and having a first and a second terminal (11, 12; 21, 22). The first terminal (11) of the first inductor (1) is adapted for connecting a radio antenna (5). The input terminal (8) of the transistor (3) is connected to the second terminal (12) of the first inductor (1), and the output terminal (6) of the transistor (3) is connected to the first terminal (21) of the second inductor (2), so that the desired impedance value ($Z_2$) at the second terminal (22) of the second inductor (2) is determined by the inductance value of the second inductor (2).

12 Claims, 15 Drawing Sheets

(51) Int. Cl.
*H01Q 5/335* (2015.01)
*H01Q 1/36* (2006.01)
*H01Q 1/48* (2006.01)

(56) References Cited

U.S. PATENT DOCUMENTS

| | | | | |
|---|---|---|---|---|
| 6,052,299 | A * | 4/2000 | Schieke | H02M 7/219 |
| | | | | 363/127 |
| 6,172,563 | B1 | 1/2001 | Trask | |
| 6,608,488 | B2 * | 8/2003 | Clinton | G01R 31/14 |
| | | | | 324/544 |
| 7,355,479 | B2 * | 4/2008 | Van Der Heijden | H03F 1/083 |
| | | | | 330/149 |
| 8,836,602 | B2 * | 9/2014 | Hutcheson | H03H 11/30 |
| | | | | 343/860 |
| 2003/0146793 | A1 | 8/2003 | Ishibayashi | |
| 2006/0077102 | A1 * | 4/2006 | Mohamadi | H01Q 3/2652 |
| | | | | 343/700 MS |
| 2013/0069835 | A1 | 3/2013 | Swais | |

OTHER PUBLICATIONS

Extended European search report for European Application 15382411.5; dated Apr. 2, 2016.

\* cited by examiner

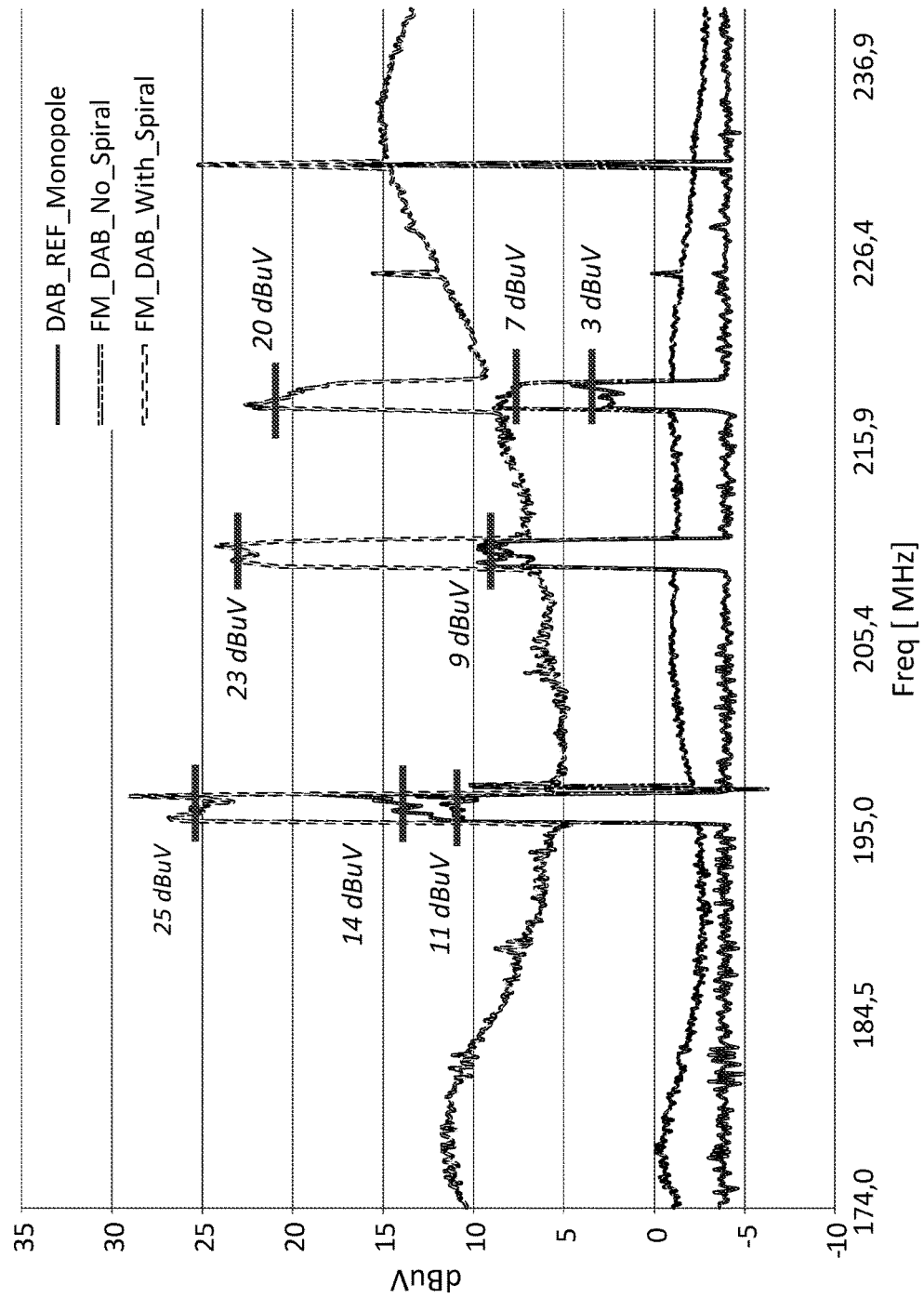

*Signal Strength*

| Antenna DAB | Station 1 | Station 2 | Station 3 |
|---|---|---|---|
| DAB No-Spiral | 11 dBuV | 9 dBuV | 7 dBuV |
| DAB Spiral | 25 dBuV | 23 dBuV | 20 dBuV |
| Ref Monopole | 14 dBuV | 9 dBuV | 3 dBuV |

*Signal Strength vs DAB Ref Monopole*

| Antenna DAB | Station 1 | Station 2 | Station 3 |
|---|---|---|---|
| DAB No-Spiral | -3 dB | 0 dB | +4 dB |
| DAB Spiral | +11 dB | +14 dB | +17 dB |

FIG. 12b

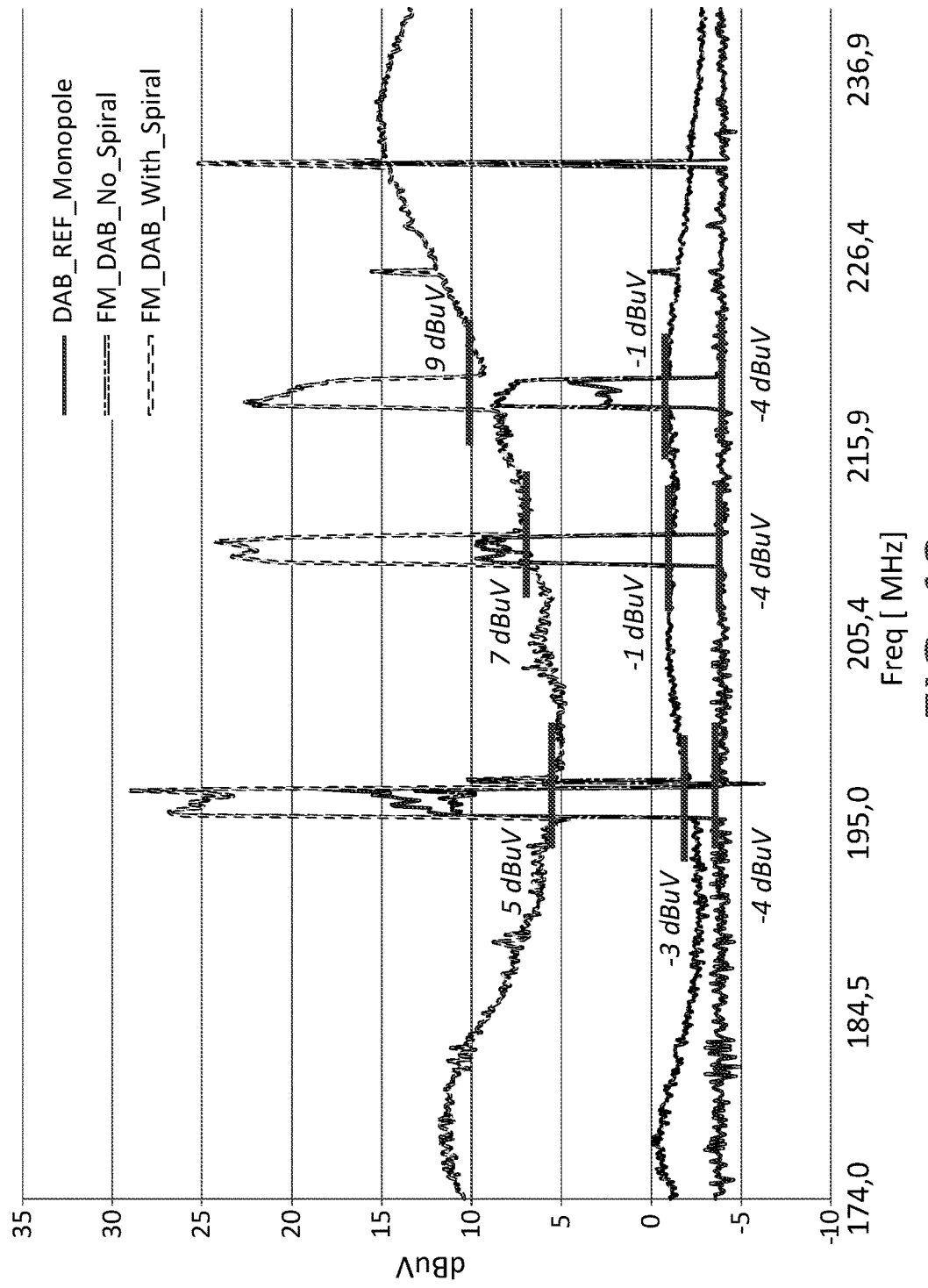

Noise Strength

| Antenna DAB | Station 1 | Station 2 | Station 3 |
|---|---|---|---|
| DAB No-Spiral | -3 dBuV | -1 dBuV | -1 dBuV |
| DAB Spiral | 5 dBuV | 7 dBuV | 9 dBuV |
| Ref Monopole | -4 dBuV | -4 dBuV | -4 dBuV |

Noise Strength vs DAB Ref Monopole

| Antenna DAB | Station 1 | Station 2 | Station 3 |
|---|---|---|---|
| DAB No-Spiral | +1 dB | +3 dB | +3 dB |
| DAB Spiral | +9 dB | +11 dB | +13 dB |

FIG. 13b

SNR

| Antenna DAB | Station 1 | Station 2 | Station 3 |
|---|---|---|---|
| DAB No-Spiral | 15 dB | 11 dB | 8 dB |
| DAB Spiral | 20 dB | 15 dB | 11 dB |
| Ref Monopole | 18 dB | 13 dB | 7 dB |

SNR vs DAB Ref Monopole

| Antenna DAB | Station 1 | Station 2 | Station 3 |
|---|---|---|---|
| DAB No-Spiral | -3 dB | -2 dB | +1 dB |
| DAB Spiral | +2 dB | +2 dB | +3 dB |

FIG. 14

IMPEDANCE MATCHING CIRCUIT

CROSS-REFERENCE TO RELATED APPLICATIONS

The present application claims priority to European Application 15382411.5 filed 3 Aug. 2015, which is hereby incorporated by reference in its entirety.

OBJECT OF THE INVENTION

The present invention relates to an impedance matching circuit and, more particularly, to an impedance matching circuit that is suitable to be applied on an IC (Integrated Circuit) chip for establishing a desired impedance value at the output of the circuit.

An object of the invention is to provide a cost-effective impedance matching circuit that is suitable for connecting a vehicular radio antenna, and capable of providing a desired impedance value at the output of the circuit.

Another object of the present invention is to provide an impedance matching circuit which is capable of providing a good stability and SNR performance.

BACKGROUND OF THE INVENTION

Radio antennas have been traditionally installed on vehicles for receiving AM/FM signals. Originally, these vehicular radio antennas were designed to cover AM and FM frequency bands without being concerned about the physical dimensions required for antennas to operate at such bands.

However, over the years the size of these radio antennas has been progressively reduced. This miniaturization addresses current customer demands, while providing a better aerodynamic response and an improved aesthetics. Further, the miniaturization helps reducing the antenna's vulnerability to vandalism compared to conventional whip antennas.

In recent years, the number of radio-communication services, such as AM/FM, telephony GNSS/SDARS or DAB antennas, on the vehicle has significantly increased and combination of several of these services in modules has become a trend. To include further services without increasing the module's volume, which is typically reduced, antenna miniaturization has become a greater concern, especially in antennas of the shark fin type.

Nevertheless, reducing the dimensions of an antenna has consequences in both its bandwidth and impedance.

Current AM/FM miniaturized antennas can have a height of even less than 65 mm, which in terms of wavelength is twelve times lower than a conventional whip antenna design for the FM band. When the volume of an antenna is drastically reduced in terms of wavelength, the expected bandwidth of the antenna suffers a drastic reduction. To make the antenna useful and solve this reduced volume of the antenna in terms of wavelength ($\lambda$), a capacitive loading is conventionally used. This problem is not limited to AM/FM antennas and can be extended to other radio antennas operating in VHF or UHF frequency bands.

As mentioned, another consequence of reducing the dimensions of the antenna is that the impedance of the antenna is considerably reduced. Considering an antenna of 65 mm of height (l) operating at 100 MHz ($\lambda$=3 m), the impedance of the antenna (Rr) would be lower than 1$\Omega$.

$$Rr = 40 \cdot \pi^2 \left(\frac{l}{\lambda}\right)^2 \quad Rr \approx 0.5\Omega$$

This lower impedance has negative effects on the performance of the antenna.

Therefore, it would be desirable in the automotive industry to provide technical means for modifying the impedance of a miniaturized radio antenna in a simple and cost-effective way, while improving current radio antennas' performance.

DESCRIPTION OF THE INVENTION

The present invention overcomes the above mentioned drawbacks by providing a circuit for establishing a desired output impedance value for a miniaturized vehicle radio antenna.

In terms of the present invention, a miniaturized antenna should be understood as an antenna that can be fitted or enclosed within a sphere having a radius smaller than $\lambda/2$, where $\lambda$ is the free spaced operating wavelength.

The invention refers to a circuit for establishing a desired impedance value for a radio antenna that comprises a bipolar junction transistor (BJT) having an emitter, a base, and a collector, and a printed radio frequency transformer comprising a first and a second inductor, both inductors having a coupling factor value. Each one of the inductors have a first and a second terminal, the first terminal of the first inductor is adapted for connecting a radio antenna for receiving an input signal and the second terminal of the second inductor is adapted for providing an output signal. The emitter of the transistor is connected to the second terminal of the first inductor, the base is grounded, and the collector of the transistor is connected to the first terminal of the second inductor, and the impedance value ($Z_1$) at the first terminal of the first inductor is determined by the coupling factor value, and the desired impedance value ($Z_2$) at the second terminal of the second inductor is determined by the inductance value of the second inductor.

In this way, a feedback loop is generated by induction from the second inductor towards the first inductor in a proportion determined by the coupling factor value, said proportion being designed to establish the input impedance value ($Z_1$) at the first terminal of the first inductor. In this way, the circuit achieves matching the impedance of the radio antenna connected thereto.

Thus, the invention provides an input impedance value for a connected vehicular radio antenna by establishing, through the coupling factor value, the proportion of the signal outputting the bipolar junction transistor that returns from the second inductor towards the first inductor. Thus, the input impedance is established by establishing the quantity of power that returns from the second inductor towards the first inductor. This returned power can be easily configurable, preferably, by the distance between the inductors.

Further, the circuit achieves to provide a desired impedance value ($Z_2$) at the second terminal of the second inductor by the inductance value of the second inductor.

With the base grounded, the bipolar junction transistor is connected in open mode. In this mode, the circuit provides a better response against noise and, then, a better intermodulation response is achieved. With this configuration, the invention obtains a better compromise between noise and linear amplifier's functionality.

The invention presents an active system which acts as a current buffer amplifier at the antenna's input. This buffer gets to translate the low impedance at the antenna's input port to the desired output impedance at the output port of the active current buffer. Usually, this desired impedance will be the standard impedance value of 50Ω.

The invention provides a circuit that allows presenting a selectable impedance value at the output of the circuit by just requiring a bipolar junction transistor and a transformer. In this way, the invention minimizes the number of components required for obtaining the desired impedance value, providing a simple and cost-effective solution.

Further, the circuit allows using integrated components, which reduces the manufacturing and production costs. Moreover, the use of integrated components allows providing economic customized circuits.

BRIEF DESCRIPTION OF THE DRAWINGS

For a better comprehension of the invention, the following drawings are provided for illustrative and non-limiting purposes, wherein:

FIG. 12a and FIG. 12b respectively show a graphic and a value table of the signal level of a DAB No-spiral antenna, a DAB spiral antenna according to a preferred embodiment of the invention, and a monopole of reference.

FIG. 13a and FIG. 13b respectively show a graphic and a value table of the noise level of a DAB No-spiral antenna, a DAB spiral antenna according to a preferred embodiment of the invention, and a monopole of reference.

FIG. 14 shows a value table of the SNR of a DAB No-spiral antenna, a DAB spiral antenna according to a preferred embodiment of the invention, and a monopole of reference.

PREFERRED EMBODIMENTS OF THE INVENTION

Figure 1:
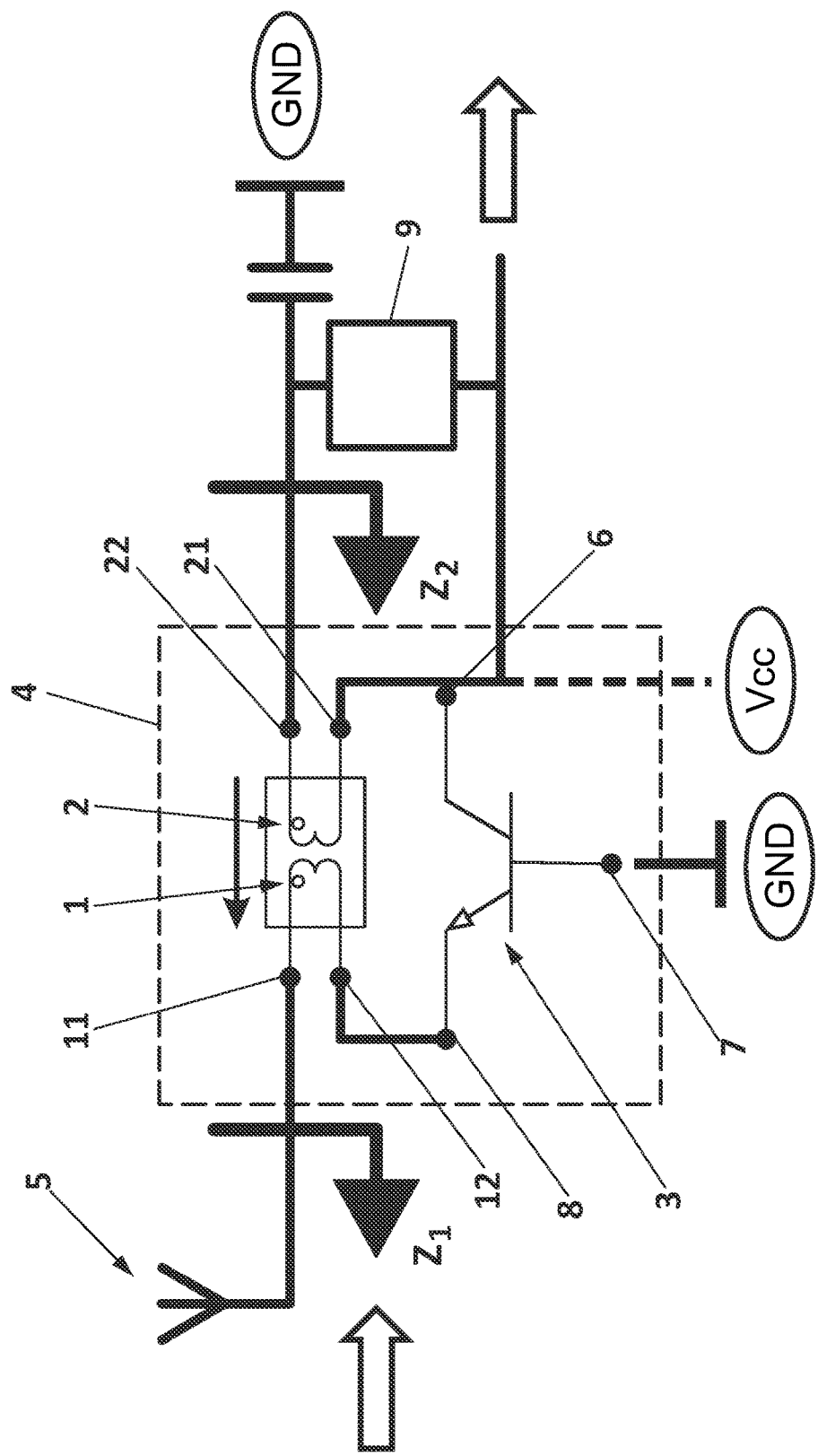
FIG. 1 shows the circuit for establishing a desired impedance value for a radio antenna, according to a preferred embodiment of the invention.

FIG. 1 shows the circuit 4 of the invention connected to a vehicular radio antenna 5. The circuit 4 is designed to transform the impedance value at the antenna output ($Z_1$) into a desired impedance value ($Z_2$) at the output of the circuit 4.

According to the invention, the circuit 4 comprises a printed radio frequency transformer having a first 1 and a second inductor 2, and a bipolar junction transistor 3 connected to the inductors 1, 2. Each one of the inductors 1, 2 has a first and a second terminal 11, 12, 21, 22. As shown, the first terminal 11 of the first inductor 1 is connected to the radio antenna 5 for receiving an input signal. The second terminal 22 of the second inductor 2 is adapted for providing an output signal. Both inductors 1, 2 have a coupling factor value. The bipolar junction transistor 3 has an emitter 8 (input terminal), a base 7, and a collector 6 (output terminal). The emitter 8 is connected to the second terminal 12 of the first inductor 1, the base 7 is connected to ground, and the collector 6 is connected to the first terminal 21 of the second inductor 2. According to this, the impedance value ($Z_1$) at the first terminal 11 of the first inductor 1 is determined by the coupling factor value, and the desired impedance value ($Z_2$) at the second terminal 22 of the second inductor 2 is determined by the inductance value of the second inductor 2.

With the base grounded, the bipolar junction transistor is connected in open mode. In this mode, the circuit provides a better response against noise and, then, a better intermodulation response is achieved. With this configuration, the invention obtains a better compromise between noise and linear amplifier's functionality. Usually, on RF amplifiers there is a trade-off between gain, noise and linearity, and with the base grounded, the invention achieves a better compromise between the mentioned features.

Figure 2:
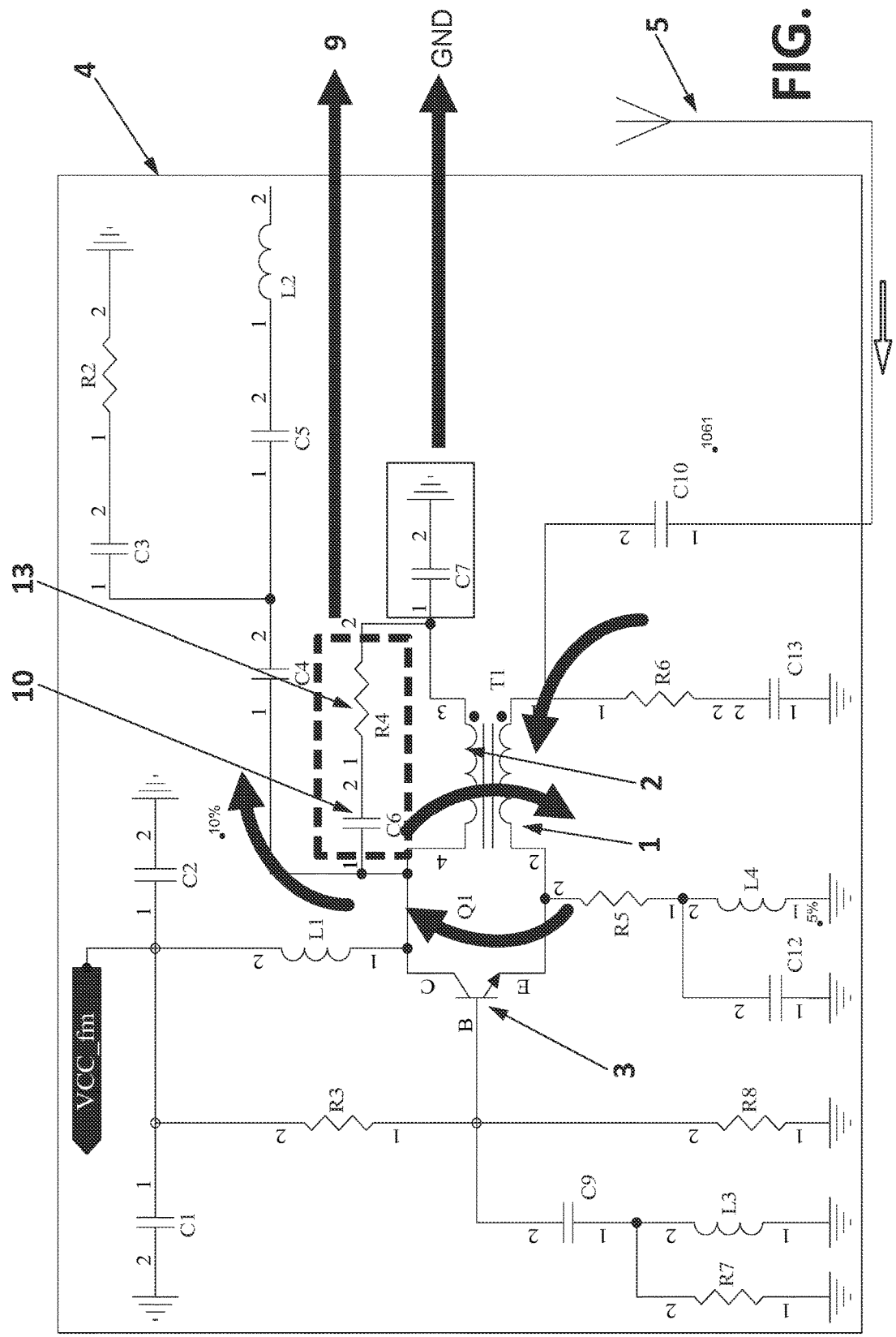
FIG. 2 shows the circuit of the invention, according to another preferred embodiment.

As schematically shown in both FIG. 1 and FIG. 2, the vehicular radio antenna 5 is connected to the first terminal 11 of the first inductor 1 to receive the input signal, said input signal outputs the second terminal 12 of the first inductor 1 to enter the emitter 8 of the bipolar junction transistor 3, which outputs an amplified signal by its collector 6. Finally, the amplified signal enters the first terminal 21 of the second inductor 2 for outputting a circuit output signal by the second terminal 22 of the second inductor 2.

The coupling of the inductors 1, 2 generates a feedback signal from the second inductor 2 towards the first inductor 1, where said feedback signal is a part of the amplified signal that enters the first terminal 21 of the second inductor 2 and is conducted through said second inductor 2. The remaining part of said amplified signal corresponds to the circuit output signal.

This way, the mutual coupling between the inductors 1, 2 determines the power that returns from the second inductor 2 towards the first inductor 1, and in consequence, the input impedance of the circuit.

Considering the circuit 4 shown in FIGS. 1 and 2, the $[S]_{BJT}$ parameters for the BJT 3 in an open mode, and the $[S]_{XTR}$ parameter of the printed radio frequency transformer are the following:

$$[S]_{BJT} = \begin{bmatrix} S_{11BJT} & S_{12BJT} \\ S_{21BJT} & S_{22BJT} \end{bmatrix}$$

$$[S]_{XTR} = \begin{bmatrix} S_{11XTR} & S_{12XTR} \\ S_{21XTR} & S_{22XTR} \end{bmatrix}$$

Thus, the input impedance of the circuit 4 is defined as:

$$S_{11} \approx S_{11BJT} + \frac{S_{21XTR}}{S_{21BJT} \cdot S_{22BJT}}$$

As a result, according to the above expression, the input impedance of the circuit 4 can be modified as a function of the mutual coupling between the inductors, which corresponds to the $S_{21XTR}$ parameter.

A desired impedance value for a radio antenna can be established at the output of the circuit once the input impedance of the circuit 4 matches the output impedance of the miniaturized antenna.

Finally, the impedance value at the output of the circuit 4, i.e. the desired output impedance value ($Z_2$) of the circuit 4 of the invention, is variable depending on the inductance value of the second inductor 2.

According to another embodiment, the circuit 4 further comprises an RC network 9 connected in parallel with the second inductor 2 to establish a frequency of operation and an output impedance value for the circuit 4.

Preferably, the RC network 9 comprises a capacitor 10 that is suitable for establishing a desired frequency of operation for the impedance selecting circuit 4.

In addition, according to a preferred embodiment, the RC network 9 comprises a variable resistor 13 suitable for selecting the impedance value ($Z_2$) at the second terminal 22 of the second inductor 2.

Figure 3:
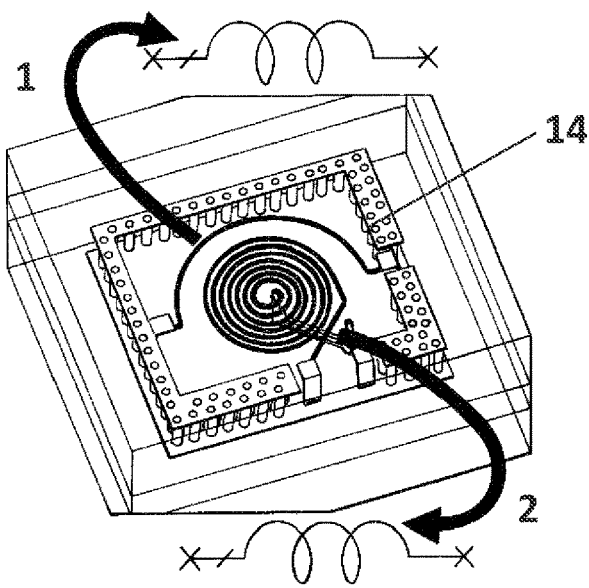
FIG. 3 shows a detailed view of the printed radio frequency transformer, according to a preferred embodiment.

FIG. 3 shows a detailed view of the printed radio frequency transformer. Preferably, the second inductor 2 is concentrically wound around a central point.

Also, according to another preferred embodiment, the first inductor 1 partially surrounds the second inductor 2, where said first inductor 1 preferably consists on a half of an arch that surrounds the second inductor 2.

According to another preferred embodiment, the printed radio frequency transformer is enclosed in a ground frame 14 to isolate radiation from the inductors 1, 2. In this way, the printed radio frequency transformer radiation does not expand to other components, avoiding interfering in other components operation.

Preferably, the first inductor 1 has an inductance value ranging from 10 nH to 20 nH. Preferably, the first inductor 1 does not have a higher inductance value because it could generate an RF input choke, which is not a desirable condition.

According to another aspect, the present invention further comprises an antenna system 20 for a vehicle, which comprises a miniaturized radio antenna 5, and the circuit 4, where the first terminal 11 of the first inductor 1 of the circuit 4 is connected to the radio antenna 5 for establishing an output desired impedance value ($Z_2$) at the output of the circuit 4.

According to another preferred embodiment, the miniaturized radio antenna 5 of the antenna system 20 is an AM/FM miniaturized radio antenna. Further preferred, the antenna system 20 further comprises a digital audio broadcasting (DAB) antenna 18. Preferentially, the DAB antenna 18 is configured as a spiral antenna having a horizontal near field pattern.

Figure 4:
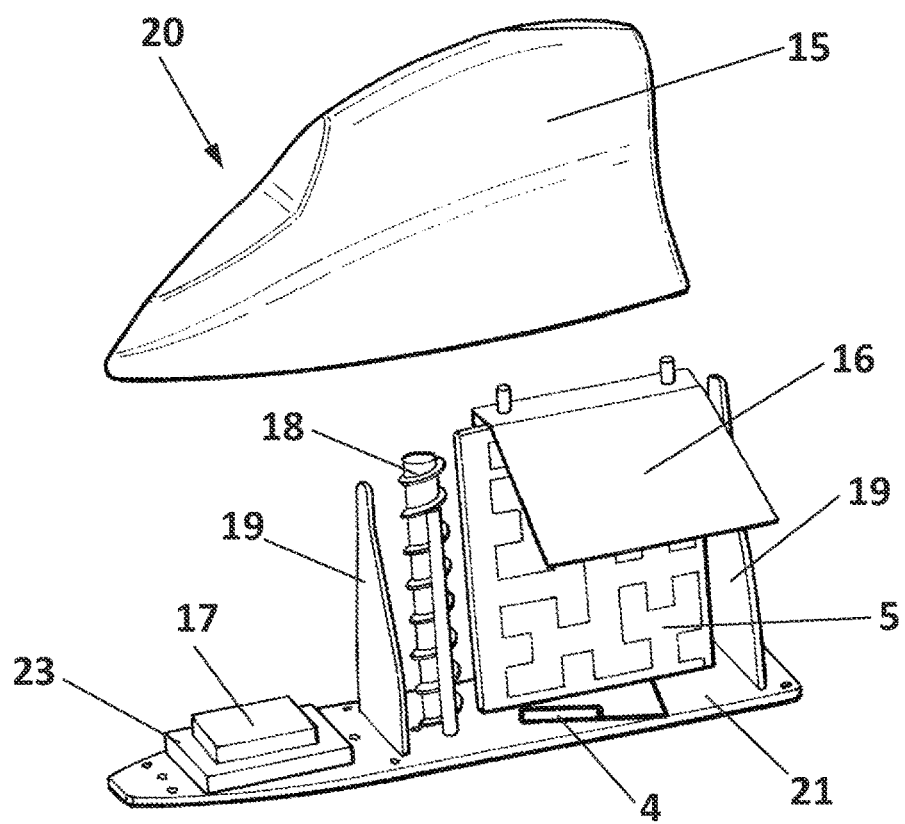
FIG. 4 shows a perspective view of a shark fin antenna system comprising a miniaturized radio antenna connected to the circuit, according to a preferred embodiment of the invention.

FIG. 4 shows a perspective view of a preferred antenna system 20 for a vehicle commonly known as a shark fin antenna system. According to the shown embodiment, the antenna system 20 comprises the miniaturized radio antenna 5, the DAB antenna 18, a MIMO antenna 19, a satellite digital audio radio services (SDARS) antenna 23 and a global navigation satellite system (GNSS) antenna 17, where all of these antennas are coupled to a common dielectric substrate 21.

As shown, a capacitor 32 is positioned over the miniaturized radio antenna 5 to simulate the presence of an extended length antenna. Further, the shark fin antenna system 20 comprises a cover 15 for enclosing all the mentioned components.

The shark fin antenna system 20 is adapted to be attached to the vehicle, generally to the vehicle roof. For example, the common dielectric substrate 21 may be detachably attached to the vehicle by means of screws (not shown) and the cover 15 may be clipped or glued to the vehicle. Another option is including a common surface to which the components are attached, for example by means of screws, and to which the cover 15 is clipped or glued to such that the common surface is then fixed to the vehicle by any known means.

Figure 5:
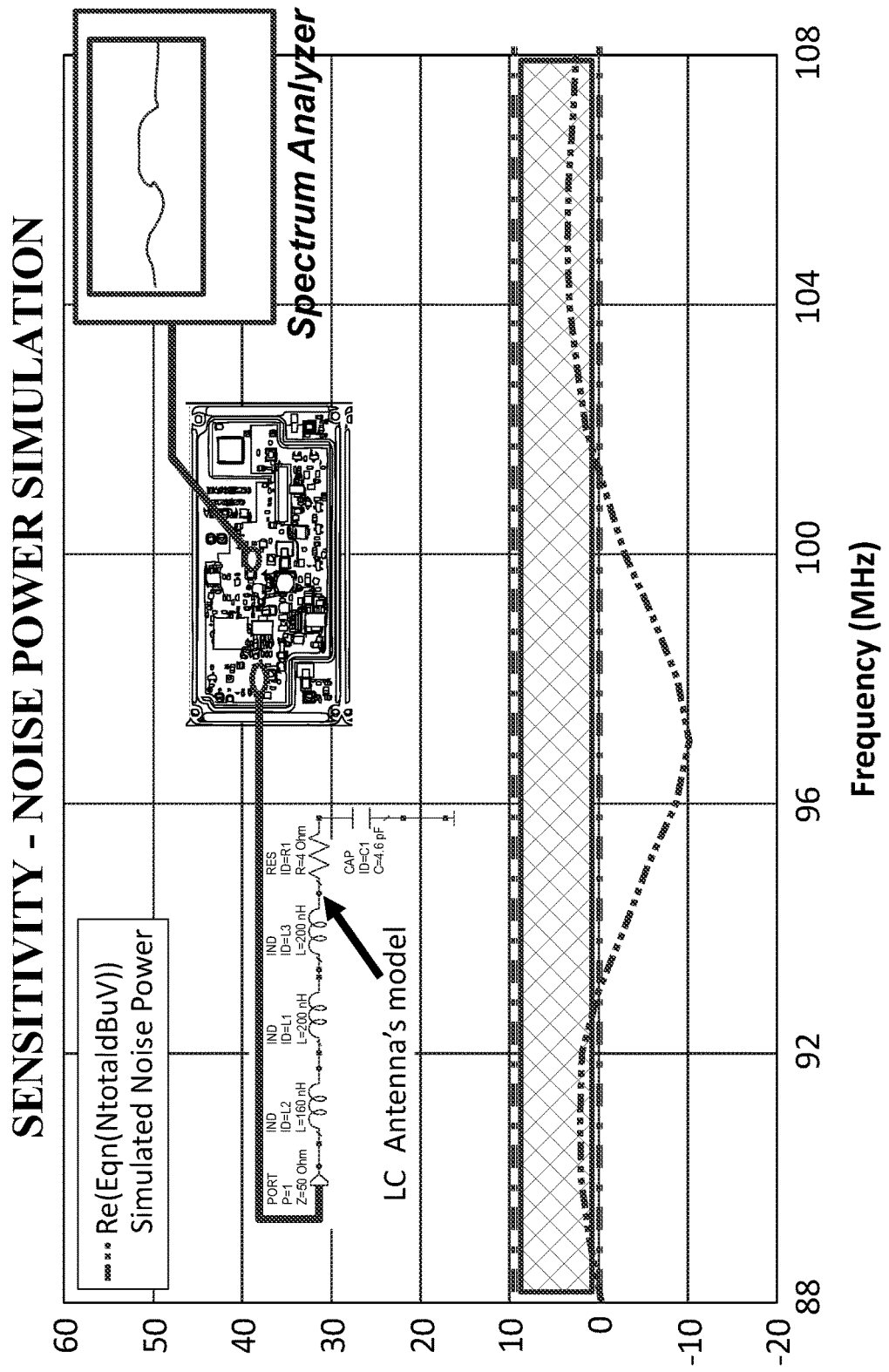
FIG. 5 shows the noise performance of the miniaturized FM antenna of the shark fin antenna system, according to a preferred embodiment of the invention.

FIG. 5 shows the noise performance of the miniaturized FM antenna 5 of the shark fin antenna system 20. As shown, the noise power level at FM is lower than 0 dBuV on a 120 KHz RBW resolution bandwidth with a 12 dB gain.

Figure 6:
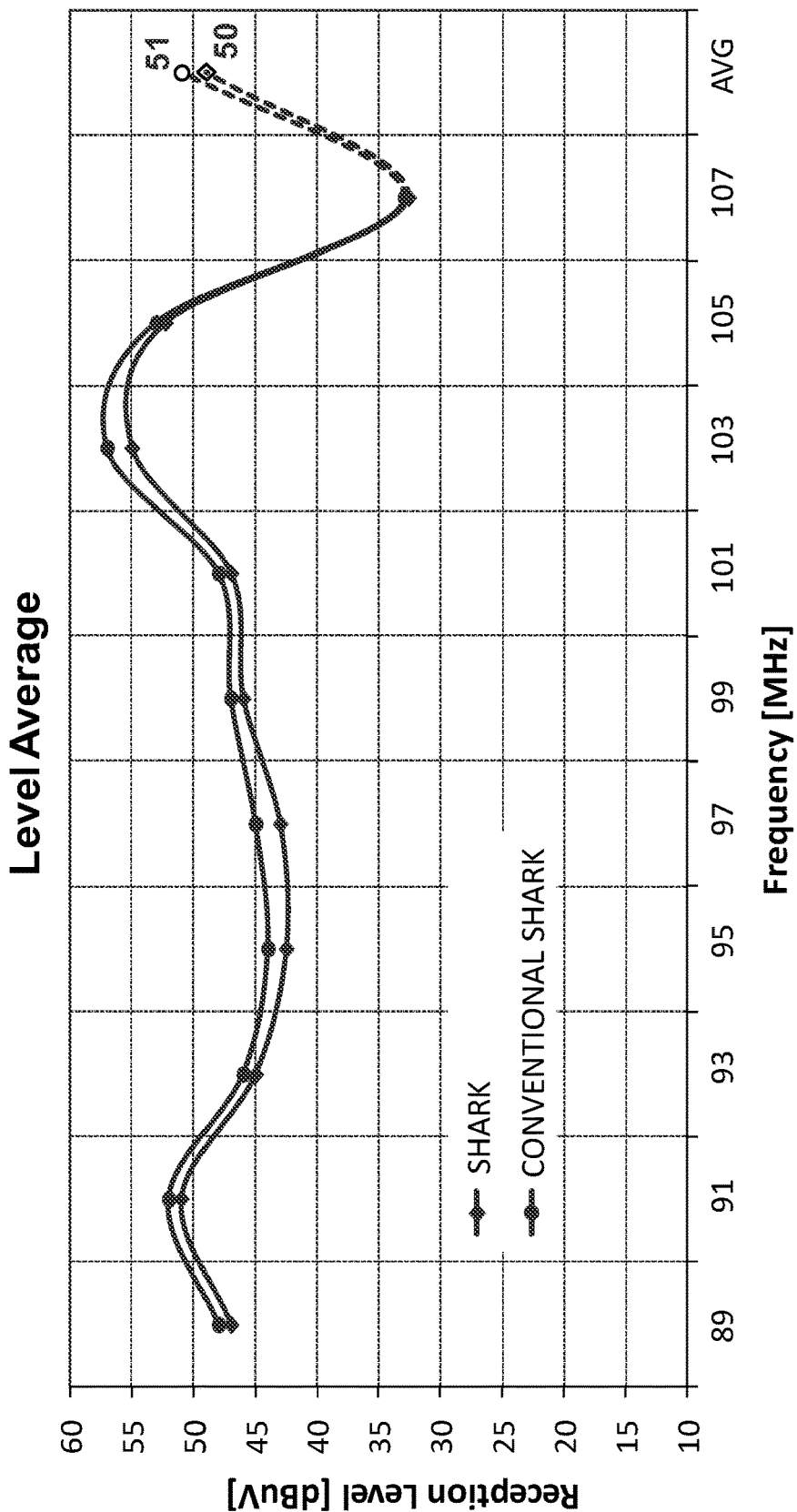
FIG. 6 shows the signal level of the miniaturized FM antenna of the shark fin antenna system of the invention versus a competitor miniaturized FM antenna.

FIG. 6 shows the signal level of the miniaturized FM antenna 5 of the shark fin antenna system 20 of the invention versus a competitor miniaturized FM antenna. As depicted, the FM signal level strength is similar with respect to the competitor antenna.

Figure 7:
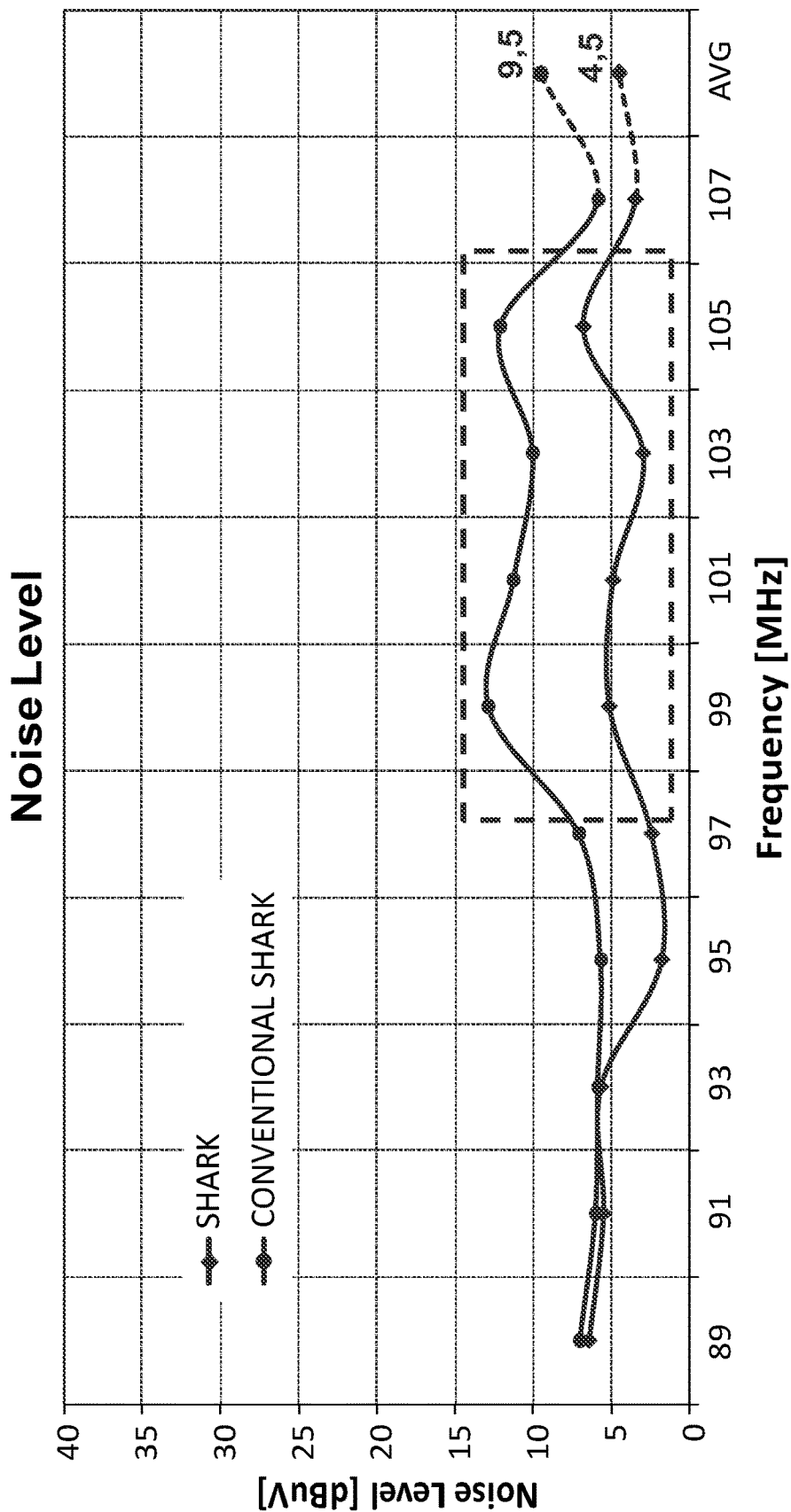
FIG. 7 shows the noise level of the miniaturized FM antenna of the shark fin antenna system of the invention versus a competitor miniaturized FM antenna.

FIG. 7 shows the noise level of the miniaturized FM antenna 5 of the shark fin antenna system 20 of the invention versus a competitor miniaturized FM antenna. In this case, the noise power level at the competitor antenna is greater on average value on 5 dB, especially on the higher part of the FM band. Thus, the invention provides means for obtaining an antenna 5 with a better behavior, and also with a higher amplification capability.

Figure 8:
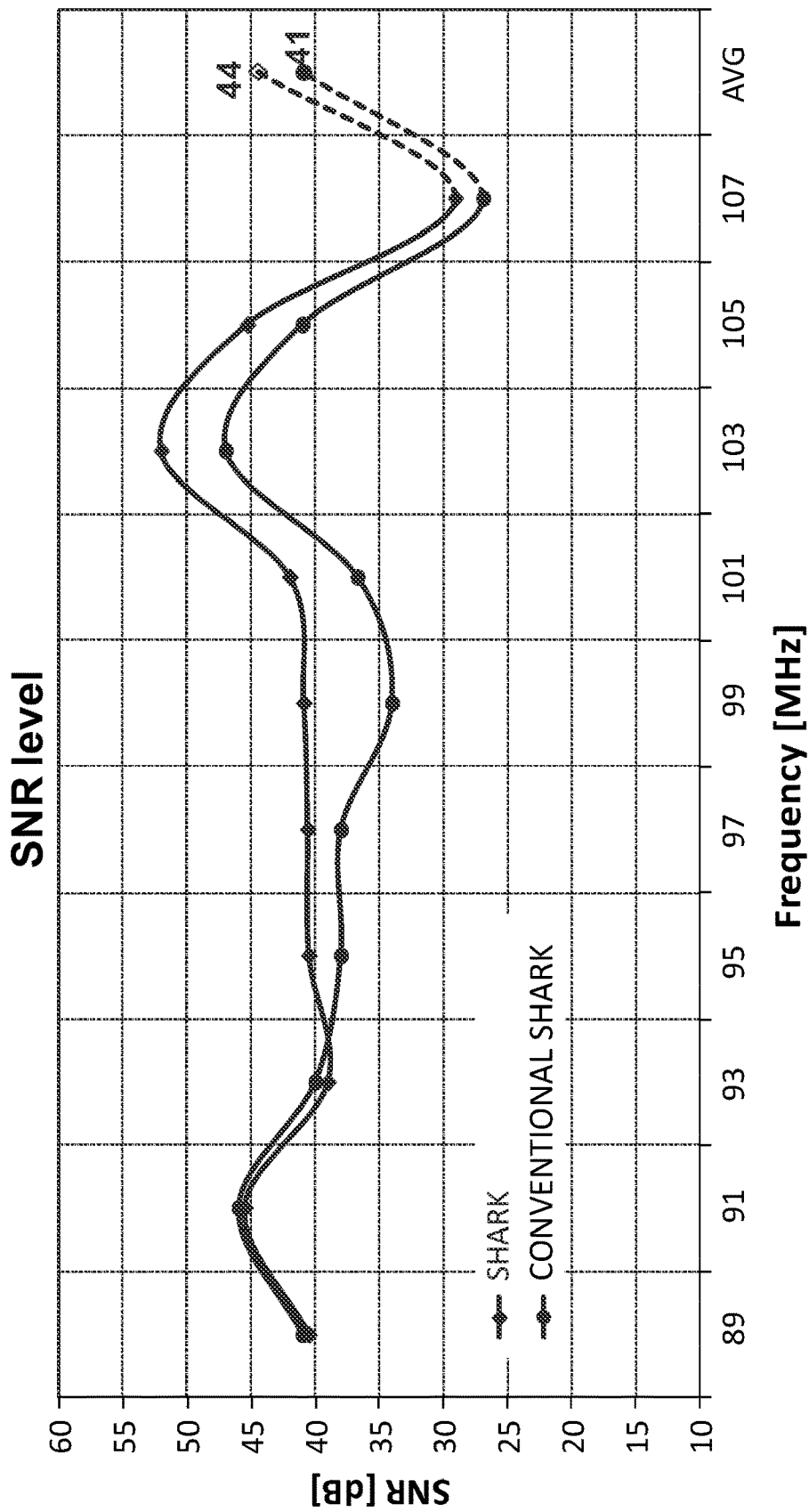
FIG. 8 shows the signal-to-noise ratio (SNR) of the miniaturized FM antenna of the shark fin antenna system of the invention versus a competitor miniaturized FM antenna.

FIG. 8 shows the signal-to-noise ratio (SNR) of the miniaturized FM antenna 5 of the shark fin antenna system 20 of the invention versus a competitor miniaturized FM antenna. As shown, the present invention achieves a better performance in terms of SNR with improved solution especially for the higher part of the FM band.

Figure 9:
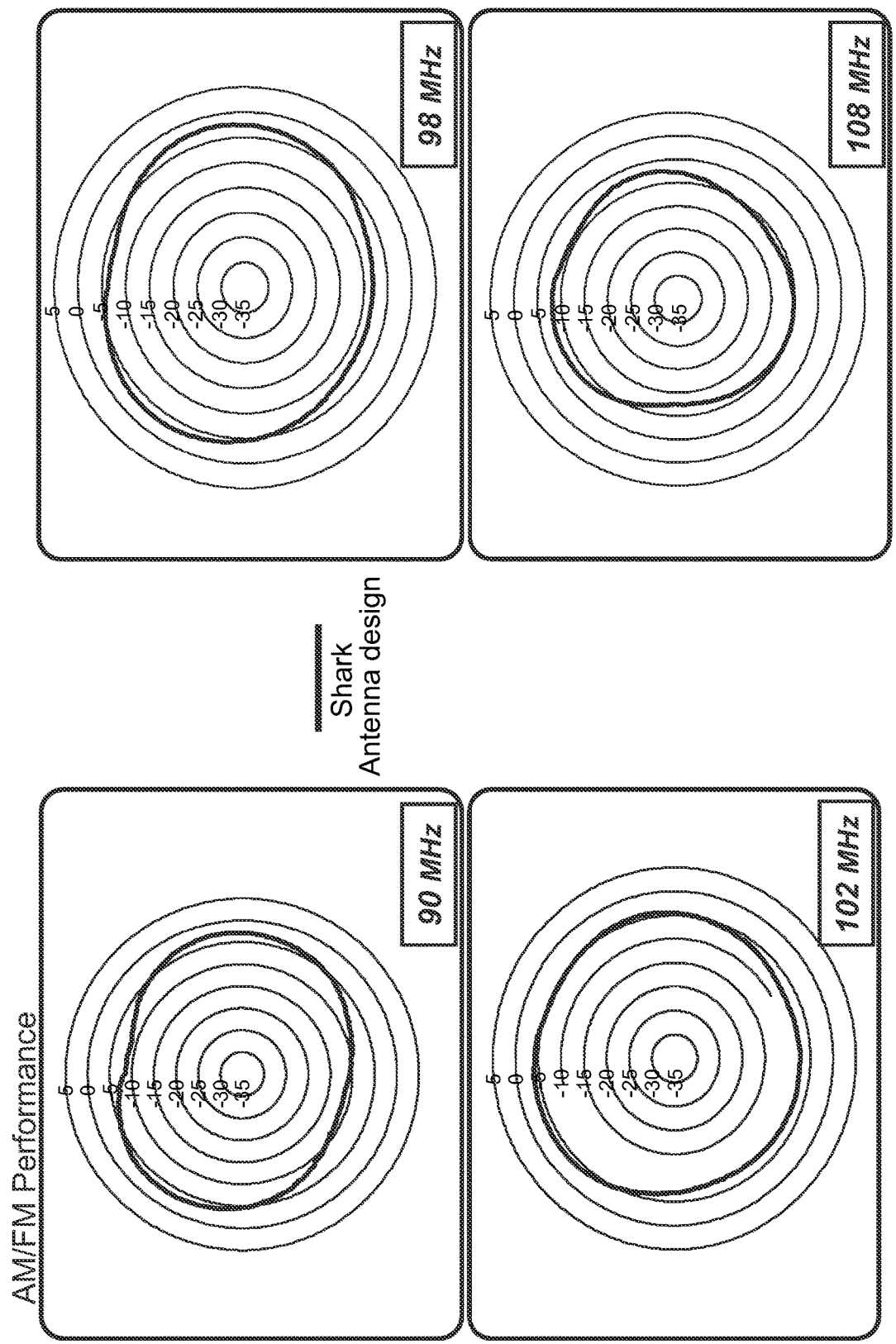
FIG. 9 shows four top views of the radiation patterns of the miniaturized FM antenna of the shark fin antenna system at four different frequencies of 90 MHz, 98 MHz, 102 MHz, and 108 MHz.

FIG. 9 shows four top views of the radiation patterns of the miniaturized FM antenna 5 of the shark fin antenna system 20 at four different frequencies of 90 MHz, 98 MHz, 102 MHz, and 108 MHz. As shown, the invention provides a quasi-omnidirectional radiation pattern with an average loss of 5 dB.

Figure 10:
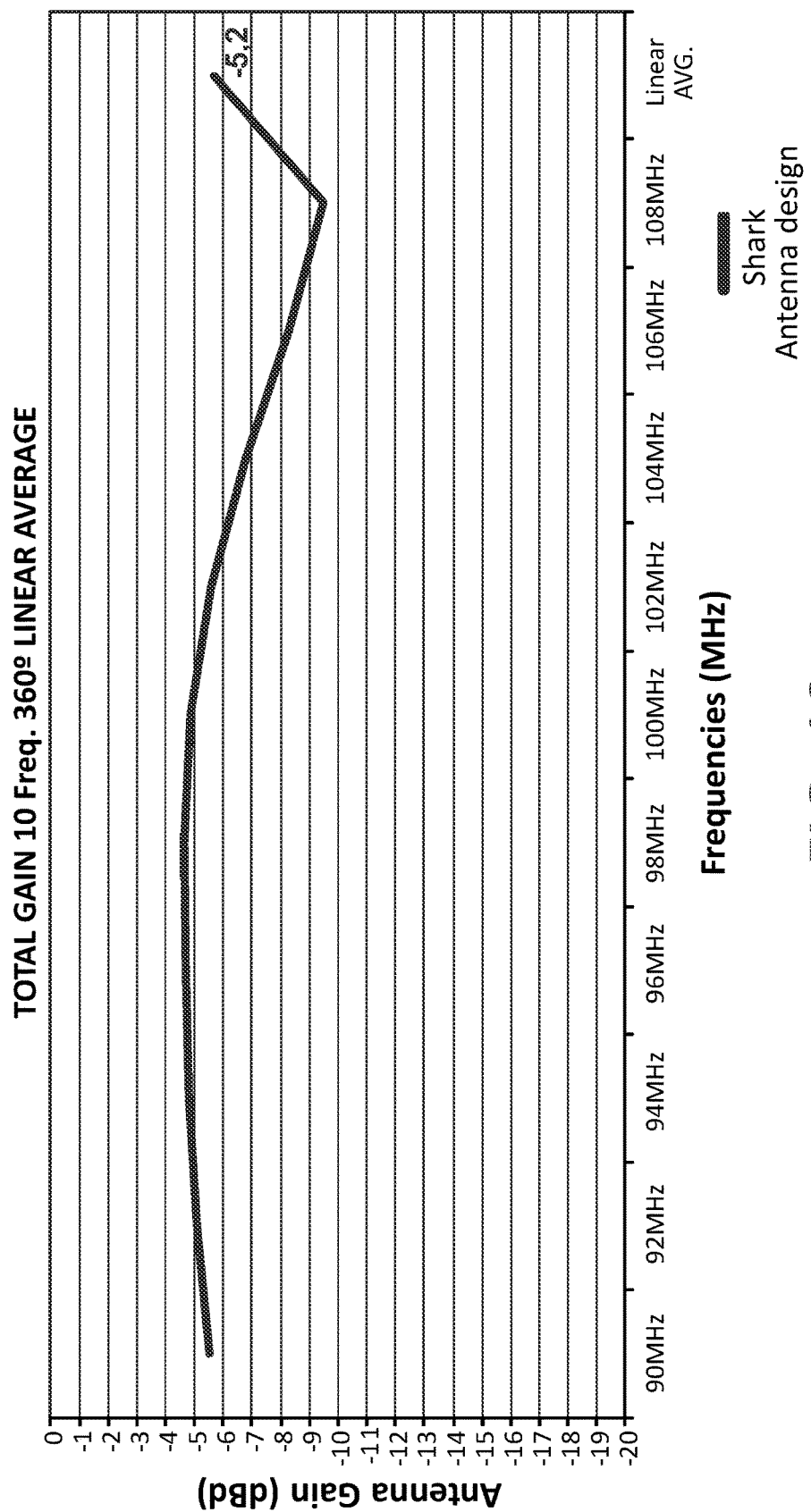
FIG. 10 shows the gain of the miniaturized FM antenna of the shark fin antenna system, according to a preferred embodiment of the invention.

FIG. 10 shows the gain of the miniaturized FM antenna 5 of the shark fin antenna system 20, according to a preferred embodiment of the invention. As shown, the invention provides good results in gain and linearity performances.

Figure 11:
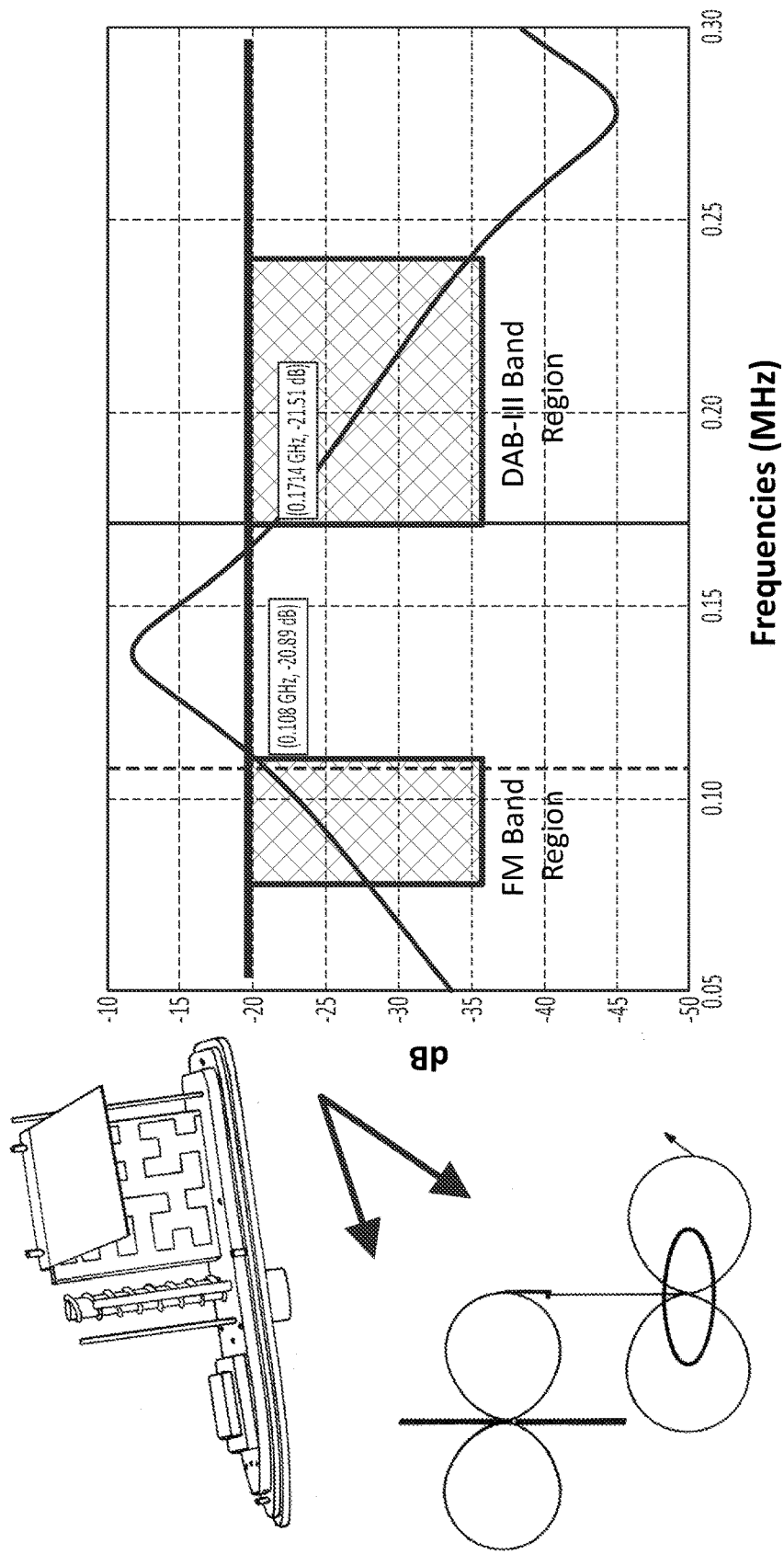
FIG. 11 shows the isolation levels between the miniaturized FM antenna and a DAB antenna, together with a schematic representation of the radiation of both the miniaturized FM antenna and the DAB antenna.

FIG. 11 shows isolation levels between the miniaturized FM antenna 5 and the DAB antenna 18, together with a schematic representation of the radiation of both the miniaturized FM antenna 5 and the DAB antenna 18. As shown, good isolation results are achieved between the FM and DAB band of operation by configuring the DAB antenna 18 to have a horizontal near field pattern, since the FM antenna 5 generates a vertical near field pattern. This configuration consists of providing a spiral antenna as DAB antenna 18.

FIGS. 12a and 12b respectively show a graphic and a value table of the signal level of a DAB No-spiral antenna, a DAB spiral antenna 18 according to a preferred embodiment of the invention, and a monopole of reference. As demonstrated, the presence of the spiral provides a clear improvement on the signal strength.

FIG. 13a and FIG. 13b respectively show a graphic and a value table of the noise level of a DAB No-spiral antenna, a DAB spiral antenna 18 according to a preferred embodiment of the invention, and a monopole of reference. As demonstrated, the noise power level increases in less range than the signal strength of FIG. 12.

FIG. 14 shows a value table of the SNR of a DAB No-spiral antenna, a DAB spiral antenna 18 according to a preferred embodiment of the invention, and a monopole of reference. Since the noise power level increases in less range than the signal strength, the whole system provides a better SNR performance by the DAB spiral antenna 18.

The invention claimed is:

1. A circuit for establishing a desired impedance value for a radio antenna, comprising:
    a bipolar junction transistor (BJT) having an emitter, a base, and a collector an, and
    a printed radio frequency transformer comprising a first and a second printed inductors, both inductors having a coupling factor value,
    each one of the inductors (1, 2) having a first and a second terminal, the first terminal of the first inductor being adapted for connecting a radio antenna for receiving an input signal, and the second terminal of the second inductor being adapted for providing an output signal,
    where the emitter of the transistor is connected to the second terminal of the first inductor, the base is grounded, and the collector is connected to the first terminal of the second inductor, and
    where the impedance value at the first terminal of the first inductor is determined by the coupling factor value, and the desired impedance value at the second terminal of the second inductor is determined by the inductance value of the second inductor.

2. The circuit for establishing a desired impedance value for a radio antenna, according to claim 1, further comprising an RC network connected in parallel with the second inductor to establish a frequency of operation and an output impedance value for the circuit.

3. The circuit for establishing a desired impedance value for a radio antenna, according to claim 2, where the RC network comprises a capacitor suitable for establishing a desired frequency of operation for the circuit.

4. The circuit for establishing a desired impedance value for a radio antenna, according to any of claims 2-3, where the RC network comprises a variable resistor suitable for selecting the impedance value at the second terminal of the second inductor.

5. The circuit for establishing a desired impedance value for a radio antenna, according to any of the preceding claims, where the second inductor is concentrically wound around a central point.

6. The circuit for establishing a desired impedance value for a radio antenna, according to claim 5, where the first inductor at least partially surrounds the second inductor.

7. The circuit for establishing a desired impedance value for a radio antenna, according to any of the preceding claims, where the printed radio frequency transformer is enclosed in a ground frame to isolate radiation from the inductors.

8. The circuit for establishing a desired impedance value for a radio antenna, according to any of the preceding claims, where the first inductor has an inductance value ranging from 10 nH to 20 nH.

9. The circuit for establishing a desired impedance value for a radio antenna, according to any of the preceding claims, where the coupling between inductors is established by the distance between said inductors.

10. An antenna system for a vehicle, comprising:
    a miniaturized radio antenna,
    a circuit according to any of the preceding claims, where the first terminal of the first inductor of the circuit is connected to the radio antenna for establishing an output desired impedance value, and
    a cover for enclosing the miniaturized radio antenna and the circuit;
    where the antenna system is adapted to be attached to the vehicle.

11. The antenna system for a vehicle, according to claim 10, further comprising at least one of an AM/FM antenna, a digital audio broadcasting (DAB) antenna, a MIMO antenna, a satellite digital audio radio services (SDARS) antenna and a global navigation satellite system (GNSS) antenna.

12. The antenna system for a vehicle, according to claim 11, where the DAB antenna is configured as a spiral antenna having a horizontal near field pattern.

* * * * *